United States Patent
Pilo et al.

(10) Patent No.: US 12,148,490 B1
(45) Date of Patent: Nov. 19, 2024

(54) AT-SPEED SYNCHRONOUS WRITE-THROUGH OPERATION FOR TESTING TWO-PORT MEMORY

(71) Applicant: Synopsys, Inc., Mountain View, CA (US)

(72) Inventors: Harold Pilo, Underhill, VT (US); Anurag Garg, Cupertino, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/119,738

(22) Filed: Mar. 9, 2023

(51) Int. Cl.
| | |
|---|---|
| G11C 29/00 | (2006.01) |
| G11C 11/418 | (2006.01) |
| G11C 11/419 | (2006.01) |
| G11C 29/12 | (2006.01) |
| G11C 29/38 | (2006.01) |

(52) U.S. Cl.
CPC ............ *G11C 29/38* (2013.01); *G11C 11/418* (2013.01); *G11C 11/419* (2013.01); *G11C 29/12015* (2013.01)

(58) Field of Classification Search
CPC ....... G11C 29/46; G11C 29/38; G11C 11/418; G11C 11/419; G11C 2029/2602; G11C 29/12015
See application file for complete search history.

(56) References Cited

U.S. PATENT DOCUMENTS

| | | | | |
|---|---|---|---|---|
| 5,701,267 | A * | 12/1997 | Masuda | G11C 29/003 |
| | | | | 365/189.11 |
| 8,289,795 | B1 * | 10/2012 | Hsu | G11C 29/08 |
| | | | | 365/201 |
| 9,767,919 | B1 * | 9/2017 | He | G11C 29/38 |
| 10,204,700 | B1 * | 2/2019 | Oh | G11C 29/56008 |
| 11,073,553 | B2 * | 7/2021 | Pradeep | G06F 11/1048 |
| 2014/0119144 | A1 * | 5/2014 | Wang | G11C 29/08 |
| | | | | 365/201 |
| 2014/0258780 | A1 * | 9/2014 | Eyres | G11C 29/4401 |
| | | | | 714/30 |
| 2017/0062074 | A1 * | 3/2017 | Kim | G11C 29/26 |
| 2017/0062077 | A1 * | 3/2017 | Kada | G11C 29/42 |
| 2020/0152285 | A1 * | 5/2020 | Nakaoka | G11C 29/12015 |

* cited by examiner

*Primary Examiner* — Esaw T Abraham
(74) *Attorney, Agent, or Firm* — Andrew L. Dunlap; Haynes Beffel & Wolfeld LLP (57) ABSTRACT

A method is provided for testing two port memory. The method includes receiving a synchronous write through (SWT) mode signal that indicates one of a functional mode of operation and a testing mode of operation of the memory, wherein the testing mode triggers bypassing of one or more read operations from bit cells of the memory identified by read address signals, and switching between the functional and testing modes of operation in dependence on the SWT mode signal. When the memory is in the testing mode of operation the circuit, receiving test data obtained from read address signals to represent a test state for the bit cells of the memory.

20 Claims, 5 Drawing Sheets

AT-SPEED SYNCHRONOUS WRITE-THROUGH OPERATION FOR TESTING TWO-PORT MEMORY

TECHNICAL FIELD

The present disclosure generally relates to enabling an at-speed write-through memory operation to facilitate testing of the functionality of a system on a chip (SoC). More particularly, the present disclosure relates to enabling an at-speed write-through memory operation for two port memories in the SoC.

BACKGROUND

In order to improve the reliability of memory on a system on a chip (SoC), the memory and the SoC are equipped to operate in two modes, a functional mode and a testing mode. The functional mode (or normal mode) is a mode in which the memory is used normally for storage and retrieval of data. The testing mode is a mode in which the performance of the input/output (I/O) ports and/or other aspects of the memory are tested using test patterns (e.g., known or predetermined patterns). One port memories that have a single port for both read and write allow for an at-speed memory bypass function to be implemented during the testing mode. During the testing mode (i.e., the implementation of the memory bypass function), bit cell states are not read, and are effectively bypassed with write data being passed to the memory read output. During the testing mode, using the memory bypass, the write data is captured and the data is clocked through to the system using the system clock to a sense-amplifier (SA) output Q. This testing is enabled by feeding the write data into the SA and strobing the SA using the system clock with identical timing as used in a functional read operation during the normal mode to emulate the functional access time to the memory for a read operation from the bit cells. Testing one port memory in this way is done with timing that is identical to the time implemented in the functional mode.

SUMMARY

A system and method are provided for in embodiments described herein for testing functionality of the two-port memory and associated logic that allows for timing synchronization during a testing mode of operation. Operation with the method includes switching between a test mode and a functional mode using a synchronous write through (SWT) signal to trigger the switching. In a test mode, the system includes sense amplifiers that normally read the state of memory bit cells but instead of being connected to the bit cells connect to address lines that provide write data directly to the sense amplifier outputs. Also in the test mode, clock control is provided so that the output of the sense amplifiers is synchronized with timing in a functional mode.

The method embodiment includes receiving a synchronous write through (SWT) mode signal that indicates one of a functional mode of operation of the memory and a testing mode of operation of the memory, wherein the testing mode triggers bypassing of one or more read operations from the bit cells of the memory identified by the read address signals. Then the method switches between the functional mode of operation and the testing mode of operation in dependence on the received SWT mode signal. When the memory is in the testing mode of operation the circuit receives test data obtained from read address signals to represent a test state for the bit cells of the memory.

In the method embodiment, the row-address bits of the address circuitry are used in testing mode to represent states of the bit cells. The path for the row-address bits to read specific memory bit cells is deactivated during test mode to avoid interference with functional operation. More specifically, a bitline restore signal enables the row-address bits to be applied as the test data to the sense amplifier outputs during a test mode, and enables the row-address bits to address the bit cells to output data from the bit cells during a functional mode. The bitline restore signal further disables the path of operation for the mode not selected by the SWT signal.

Further in the method embodiment, a clock signal is provided to a latch receiving the sense amplifier outputs. The clock enables data that is captured in dependence on the clock signal in the testing mode to be provided as an output (Q) with a delay to emulate a read operation delay that is present in the functional mode.

A system embodiment includes a test mode control circuitry, test mode circuitry and functional mode circuitry. The test mode circuitry is configured to receive a synchronous write through (SWT) mode signal and configured to and in dependence on a value of the SWT mode signal, switch between (i) a functional mode of operation of the memory and (ii) testing mode of operation of the memory that triggers bypassing of one or more read operations from the bit cells of the memory identified by the read address signals. The functional mode circuitry includes: (1) read write decoder circuitry configured to receive the read address signals through enabling logic as controlled by the SWT mode signal to provide read write line signals; and (2) bit cells receiving the read write line signals from the read write line decoder and providing read bit line state output signals in response.

The test mode circuitry includes components to emulate the functional mode without accessing the bit cells, as well as clock circuitry to enable emulating the time of operation in the functional mode while in the test mode. The test mode circuitry includes: (1) address circuitry configured to receive read address signals identifying bit cells of the memory and provide outputs as test data; and (2) test output circuitry configured to, in the testing mode of operation, receive the test data obtained from the address circuitry and compare the received test data to intended values represented by the received address signals.

The test mode circuitry further includes additional components added to sense amplifiers that are used in a function mode to read the bit cells, the additional components to enable test mode embodiments. The additional sense amplifier circuitry includes components to: (i) receive values from the bit cells during functional mode and bypass the bit cells during test mode (ii) receive the address signals instead of bit cells during a test mode; and (iii) control mode components based on the SWT mode signal to switch between providing the bit cell values as sense amplifier outputs during a functional mode and to provide the address signals as sense amplifier outputs during a test mode. The sense amplifier circuitry is further connected to provide data outputs (Q) through output latches that receive clocking signals to enable synchronization between functional mode and test mode.

To achieve clocking needed to synchronize the functional mode and test modes, the system further includes a clock generator circuit. The clock generator circuit provides a clock signal to the address circuitry, the sense amplifiers and output latches so that during test mode data is captured using the clock signal and the test data is provided from the output latches with a delay to emulate a read operation delay that is present in the functional mode.

The system further includes enable logic to switch between test mode and functional modes. The enable logic includes address enable logic providing address signals as bit cell replacement signals in test mode as controlled by the SWT signal. The enable logic further includes read enable logic providing address signals from bit cells during functional mode as controlled by the SWT signal.

The sense amplifier internally includes internal transistor circuitry that receives a read bitline restore signal and functions to control the transistor circuitry to switch between the test and functional modes within the sense amplifier. The read bitline restore signal controls transistors to enable the bitcell connection to the sense amplifier outputs during functional mode and connect the address signals to the sense amplifier outputs during test mode. The read bitline restore signal further disables transistors to bypass the bitcells during test mode and to disable a connection from the address lines to the output during the functional mode.

Embodiments described herein further comprise a non-transitory computer readable medium comprising stored instructions, which when executed by a processor, cause the processor to generate a digital representation of a circuit. The digital circuit representation includes test mode control circuitry that receives a synchronous write through (SWT) mode signal and, in dependence on a value of the SWT mode signal, switches between (i) a functional mode of operation of the memory and (ii) testing mode of operation of the memory that triggers bypassing of one or more read operations from bit cells of the memory identified by read address signals (XADR0, XADR1). The digital circuit representation further includes test mode circuitry including address circuitry that receives the read address signals identifying the bit cells of the memory and provide outputs as test data. The digital circuit representation further includes functional mode circuitry including read write decoder circuitry that receives the read address signals through enabling logic as controlled by the SWT mode signal to provide read write line signals (RWL0, RWL1), wherein the bit cells receiving the read write line signals (RWL0, RWL1) from the read write decoder circuitry and providing read bit line state output signals (RBL0, RBL1, RBL2, RBL3) in response.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Efficiently testing two port memory requires different timing and data routing schemes, as opposed to the scheme implemented for one port memory discussed above. Two port memories for instance have separate read and write ports with separate clocks at each port, so timing is not synchronized between the read and write ports.

For accurate testing of the memory or logic controlled by the memory, in embodiments described herein a bypass mode is provided for testing that can provide similar performance conditions as a functional mode. Both for memory and logic connected to the memory, testing is provided for in embodiments described herein with memory in bypass mode, referred to as a testing mode. The bypass used during the testing mode will provide synchronization and have similar timing to when the memory is used in the functional mode.

Memory bypass is provided in two port memory in embodiments as enabled using a synchronous write through (SWT) signal. The SWT mode signal effectively enables the memory functionality to be tested with the memory bit cells being bypassed and not accessed during the testing mode. The SWT mode signal triggers address bits to be written to outputs of sense amplifiers rather than the bit cell states which are bypassed. Clock synchronization is further provided in the SWT mode so that operation in the testing mode has the same timing as the operation of the functional mode.

Embodiments described herein enable an at-speed, synchronous write-through operation for two-port memories with circuitry added to improve design-for-test (DFT) coverage. The two port memory access times between SWT test operations and functional operations are clock aligned in embodiments by using sense amplifier circuitry with clock driven outputs. Latched read addresses are further driven to the sense amplifiers, and these read address are used as bit cell values on the read bit lines to source the test data vectors from the sense amplifier outputs in the testing mode.

Technical advantages of the present disclosure include, but are not limited to, providing for testing of a two port memory in a bypass mode with timing that is synchronized with functional mode. The advantages further include use of a SWT mode signal and additional sense amplifier circuitry to trigger writing of address bits to the outputs of sense amplifiers so that the bit cell state reading can be bypassed during a test mode. Further advantages include output latches being provided after the sense amplifiers receive a clock signal to enable timing in the test mode to match the timing of the functional mode.

Figure 1:
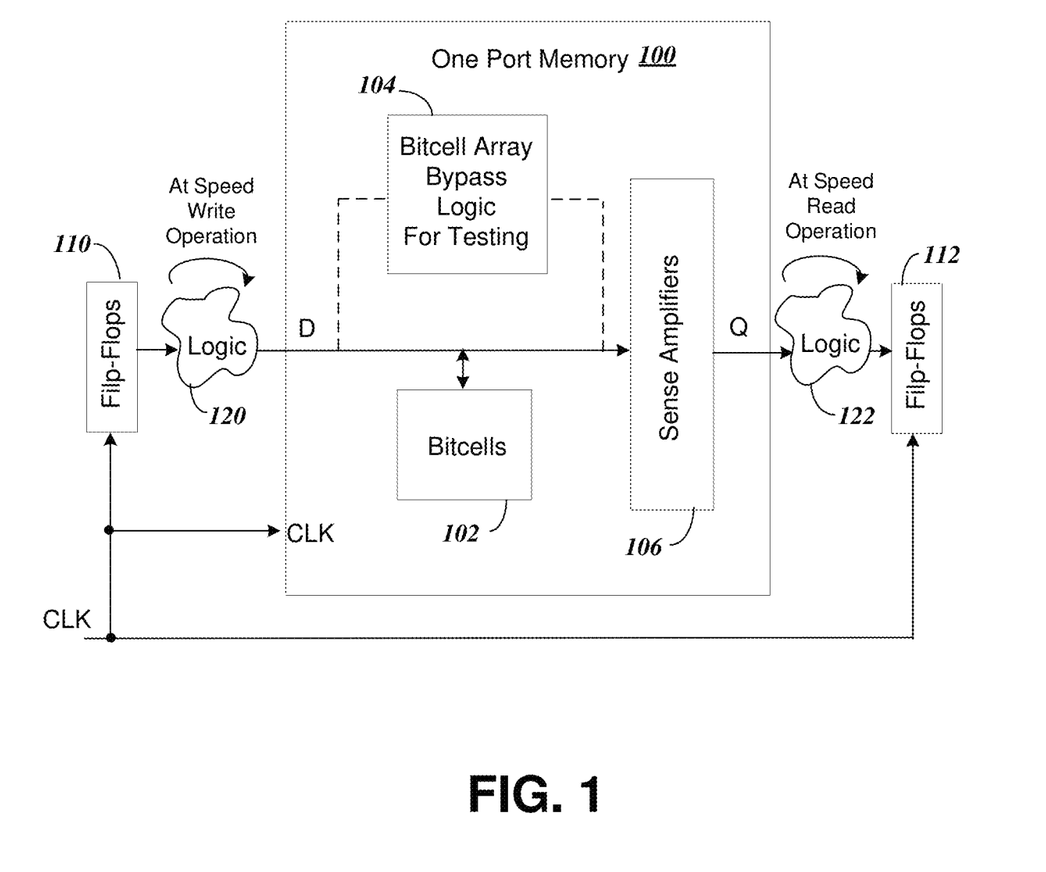
FIG. 1 shows a block diagram of circuit components of a one port memory test system that uses a bypass mode for testing during a testing mode of operation.

FIG. 1 shows a block diagram of circuit components of a one port memory 100 that is configured for testing and uses a bypass mode during testing. The one port memory 100 shown has a single port to access bit cells 102 for both read and write operations. During testing, the one port memory 100 does not access the bit cells 102, and instead implements a test operation using bypass logic 104. During testing write data (D), which would otherwise be written to bit cells 102 in a functional mode, is captured and delivered through the bypass logic 104 to the sense amplifiers 106, which output data (Q) as clocked by the clock signal (CLK). The sense amplifiers 106, which operate in a functional mode to read data from bit cells 102, instead receive the data (D) from the bypass logic 104 and provide the data (Q).

The clock signal (CLK) enables test data to be provided to the sense amplifiers 106 to output data (Q) in the test mode to be synchronized with data that would be read from the bit cells 102 being provided at the sense amplifier 106 during a functional mode. The same clock signal (CLK) that drives the one port memory 100 is provided to flip-flops 110 that provide inputs to the one port memory 100 and to flip-flops 112 that provide outputs from the one port memory. Testing one port memory using the common clock signal (CLK) allows for the with identical timing in both the testing mode and the functional mode.

The outputs of flip-flops 110 are provided through logic 120 which provides the data (D) input to the one port memory 100. This enables a data write operation to be provided through logic 120 that is being tested so that the data write operation can have identical timing in test mode as in a functional mode. Such an identical test mode time is referred to herein as "at speed" to indicate that the operation (e.g., write, read, etc.) speed in test mode and functional mode are substantially identical. Thus, with the circuit of FIG. 1, an at speed write operation can be provided, as illustrated. Further, logic 122 being tested is connected between the one port memory 100 and the flip-flops 112. This enables a read operation to be provided through the logic 122 that is being tested so that the read operation can have identical timing in the test mode as in functional mode. Thus, with the circuit of FIG. 1, an at speed read operation can also be provided, as illustrated.

Figure 2:
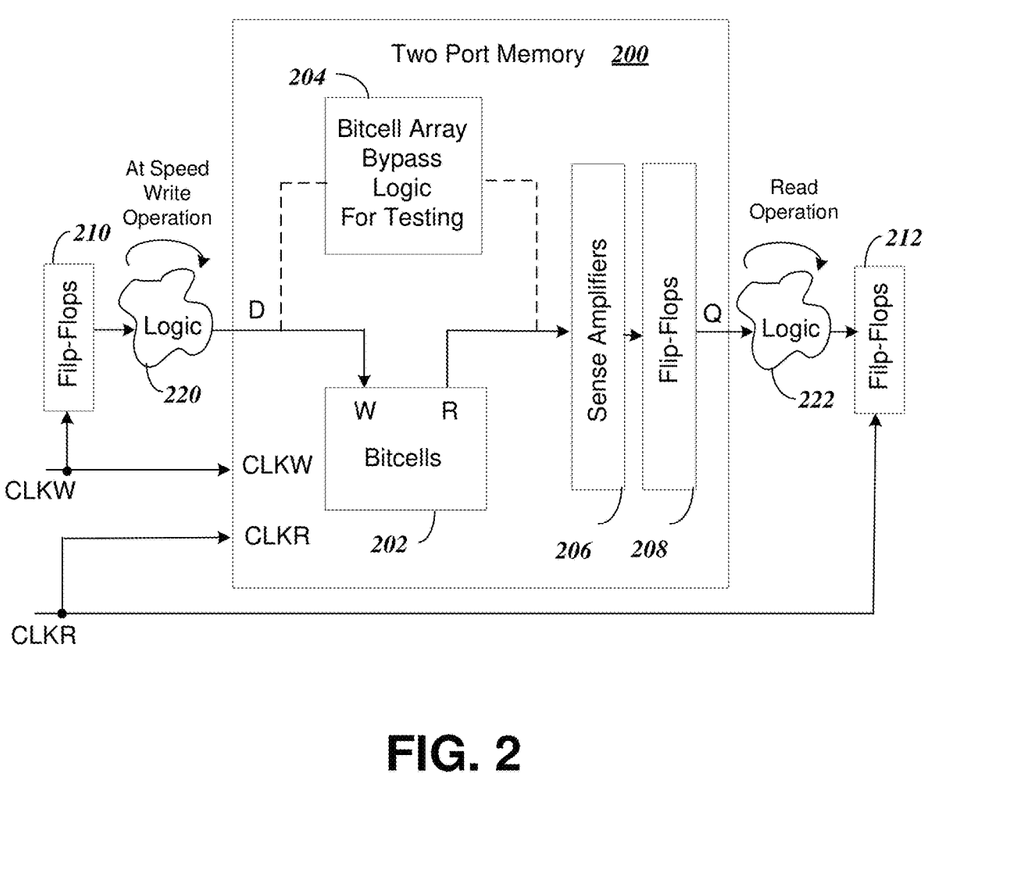
FIG. 2 shows a block diagram of circuit components of a two port memory test system that uses a bypass mode for testing during a testing mode of operation.

FIG. 2 shows a block diagram of circuit components of a two port memory 200 that also includes bypass logic 204 to allow for testing in a memory bypass mode. The two port memory 200 has separate read and write ports to the bit cells 202, so timing is not automatically synchronous with memory in a bypass testing mode relative to a functional mode like that in a one port memory, as described with reference to FIG. 1. Asynchronous write and read ports in the two-port memory 200 have separate signals, including clock signal (CLKW) and clock signal (CLKR) so that data-in from the write port being sourced as test data during testing operations for the read port will not have timing similar to when data is read in a functional mode when they are clocked with the separate clock signals (CLKW) and (CLKR).

Also, to complicate synchronization in the two port memory 200 of FIG. 2, without the added flip flops 208 providing output data (Q) of the sense amplifiers 206 as the memory output, the read data path will be asynchronous from the read bitline output because there is no clock connection to provide the memory data (Q) output. Even with the added flip-flops 208, the delay of output data (Q) is decoupled from the read path because of the separate clock signals (CLKW) and (CLKR). The added flip-flop 208 circuitry also increases area occupied by the test circuitry.

The two-port memory circuit of FIG. 2, similar to the one port memory of FIG. 1, includes input flip-flops 210 connected to provide write data to the memory and output flip-flops 212 connected to receive read data from the memory. Unlike with the one port memory, the flip-flops 210 and 212 are driven by separate read and write clock signals (CLKR) and (CLKW). The separate clock signals (CLKR) and (CLKW) provided to flip-flops 210 and 212 make synchronizing test data provided to the write port with test data received at the read port more difficult.

FIG. 2 further illustrates input logic 220 located between flip-flops 210 and the two port memory 200 and also illustrates output logic 222 located between the two port memory 200 and flip-flops 212. In a similar manner as FIG. 1, the input logic 220 and the output logic 222 can be tested. For example, when the output logic 222 is being tested, a read operation can be performed which is not an at speed read operation because the read clock signal (CLKR) is separate from the write clock signal (CLKW). The read operation is, thus, provided through the output logic 222 that is driven only by the read clock signal CLKR and cannot be synchronized with the write clock signal (CLKW) to provide an at speed read operation. FIG. 2 illustrates the read operation above the output logic 222, showing that an at speed read operation is not available. The write operation does not need to access the output logic 222, so an at speed write operation can be performed in both the functional mode and the testing mode using only the input logic 220 and write clock signal (CLKW), as illustrated. Thus, the two port memory 200 illustrated in FIG. 2 may not be able to test an at speed read operation.

Figure 3:
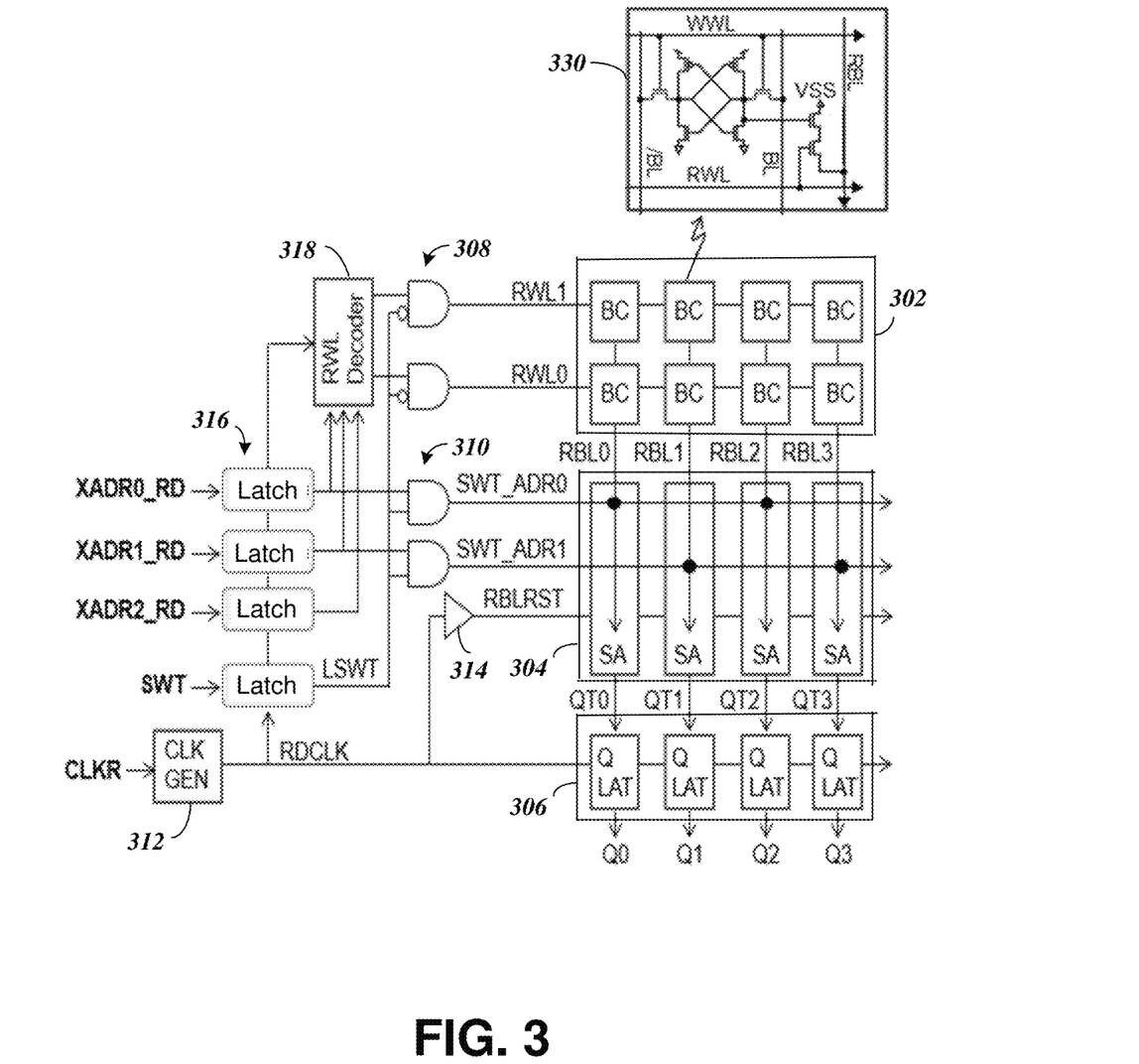
FIG. 3 shows a detailed block diagram of circuit components of a two port memory test system used in embodiments described.

FIG. 3 shows a detailed block diagram of circuit components of a two port memory test system used in embodiments described that allows for synchronization of the testing mode and the functional mode. The system of FIG. 3 includes bit cells 302 (of the two-port memory) with circuit connections to the bit cells that are similar to other two-port memories. The bit cells 302 include connections to receive address bits, or read word lines (RWLs) with two lines RWL0 and RWL1 shown. Further read bitline (RBL) connections are included with four illustrated as RBL0, RBL1, RBL2 and RBL3. A two port eight transistor bit cell circuit 330 is shown that illustrates connections to the RWL and RBL that can be used for the bitcells 302. Although not necessarily utilized with respect to embodiments described herein, the bit cell 330 further includes a write word line (WWL) and bit line (BL) and an inverse bit line (/BL) connection.

The circuit of FIG. 3 further includes sense amplifiers 304 that connect to the bit cells 302 and provide outputs QT0, QT1, QT2 and QT3. The sense amplifiers 304 are configured to include connections to receive address lines (SWT_ADR0, SWT_ADR1) (read address signals) that are controlled by a SWT mode signal. The SWT mode signal determines whether the memory is in a functional mode or testing mode of operation that triggers bypassing of a read operation from the bit cells 302 identified by the read address signals. The sense amplifiers 304 receive a read bitline restore signal (RBLRST) signal that is controlled by a clock generator circuit 312. The signals such as SWT, SWT_ADR0 and other control signals are provided from as test signals from a test controller or processor that is not shown in FIG. 3.

The address lines (SWT_ADR0, SWT_ADR1) are provided to the sense amplifiers 304 from AND gates 310. A second input to the AND gates 310 is the SWT mode signal. The SWT mode signal controls the AND gates 310 to effectively enable or disable the address lines (SWT_ADR0, SWT_ADR1) from being provided to the sense amplifiers 304 depending on the state of the SWT mode signal. An inverse of the SWT mode signal is also provided to AND gate buffers 308 that connect the read word lines RWL0 and RWL1 to address the bit cells 302. The SWT mode signal provided to gates 308 and 310 functions to: (i) provide the address lines (SWT_ADR0, SWT_ADR1) to the sense amplifiers 304 during the testing mode and (ii) provide the RWL0 and RWL1 signals to address the bit cells 302 to connect them to the sense amplifiers 304 when the SWT mode signal indicates the functional mode and that testing is not occurring.

The RBLRST signal provided to the sense amplifiers 304 (from the buffer 314) provides an enable and disable function relative to either the address lines (SWT_ADR0, SWT_ADR1) and the read bit lines RBL0-RBL3. The RBLRST signal is provided through the buffer 314 from the clock generator circuit 312. With the clock signal (RDCLK) toggling, depending on which of the address signals or the bit cell signals are provided to the sense amplifiers 304, the RBLRST signal will disable the signals SWT_ADR or RBL that are not active signals and enable a path for the active signals to pass to the QT0-QT4 outputs of the sense amplifiers 304.

The circuit of FIG. 3 also includes Q latches 306 that receive the sense amplifier outputs QT0-QT4 and provide outputs Q0, Q1, Q2 and Q3. The Q latches 306 are clocked by the clock generator circuit 312, enabling the outputs Q0, Q1, Q2 and Q3 to have a same timing in the testing mode as the output signals provided in the functional mode.

The circuit of FIG. 3 also includes latch circuitry 316 to latch the read addresses XADR0_R, XADR1_R and XADR2_R as well as an SWT input to provide the SWT mode signal. Also, a RWL decoder 318 is included to decode the read addresses to address a desired one of the bit cells 302.

In operation with the circuit of FIG. 3, during the testing mode, test data is sourced through address circuitry including a 2-bit latched read address signals SWT_ADR0 and SWT_ADR1 that connect to alternating sense amplifiers 304. Further in the testing mode, the read bitline restore signal RBLRST transfers SWT_ADR0 and SWT_ADR1 through the sense amplifiers 304 instead of the read bitline signals RBL0-RBL3 (e.g., the RBLRST signal can disable the read bitline signals RBL0-RBL3).

In operation of the circuit of FIG. 3 in the functional mode the SWT mode signal triggers the RBL0-RBL3 signals from the bit cells 302 to discharge into the sense amplifiers 304. Further in the functional mode, the RBLRST signal connects to discharge the address signals provided to the sense amplifiers (from the gates 310) 304 and disable them.

With either the functional mode or the testing mode, the read clock applied to latches 306 will create the same timing. In this way, the test data and functional output data will be aligned with data outputs Q provided in the test mode.

Figure 4:
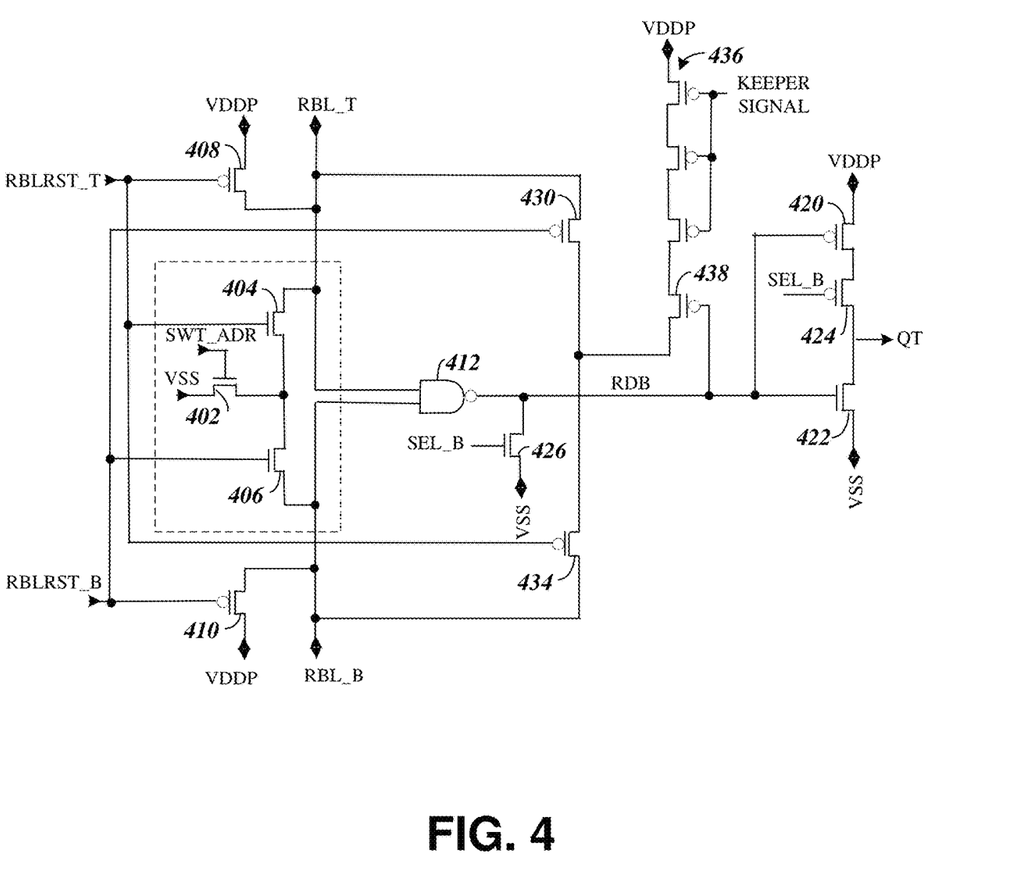
FIG. 4 shows an example circuit for performing operations of the sense amplifiers illustrated the detailed block diagram of FIG. 3.

FIG. 4 shows an example of circuitry used for sense amplifiers 304 illustrated in the detailed block diagram of FIG. 3. The two port memory sense amplifier of FIG. 4 includes n-type metal oxide semiconductor (NMOS) transistors 402, 404 and 406 shown within the dashed lines to inject SWT_ADR address signals into the RDB data signal when in a SWT mode (e.g., the testing mode). The SWT_ADR signal is provided to the gate of transistor 402 which connects the system source (VSS) to a common node, or control node, connecting transistors 404 and 406. The gates of transistors 404 and 406 receive the respective RBLRST_T and RBLRST_B signals, with RBLRST_T being the RBLRST signal from FIG. 3 and RBLRST_B being its inverse. The current path of transistors 404 and 406 then connect the control node to one of the inputs of NAND gate 412 that provides the RDB data signal to generate the sense amplifier output (QT). Device sizes of transistors 402, 404 and 406 are chosen similar to the size of NMOS transistors within a bit cell so that RDB data signal discharge in the testing mode will be aligned in the sense amplifier with discharge rate during the functional mode with the RWL selected to drive the sense amplifier outputs. The RBLRST_T and RBLRST_B signals are also connected to the gates of respective PMOS transistors 408 and 410 which connect to the voltage supply VDDP and operate in conjunction with the NMOS transistor 402 which connects to VSS to drive the inputs of NAND gate 412 when the SWT_ADR signal is applied to control the RDB data signal.

With the testing mode deactivated, the RBLRST_T and RBLRST_B drive respective PMOS transistors 430 and 434 to apply the RBL_T and RBL_B signals to the NAND gate 412 inputs, with RBL_T being the RBL signal from FIG. 3 and RBL_B being its inverse. Timing of the RBLRST_T and RBLRST_B is controlled so that the testing mode of operation and the functional mode are synchronized. A keeper latch circuitry holds the state of the RBL_T and RBL_B signals using stacked PMOS transistors 436 that connect to VDDP in a current path and receive a keeper gate control signal, along with PMOS transistor 438 that is controlled by the state of the RDB data signal from the NAND gate 412. The keeper control signal is provided from a controller to maintain the state of the RBL (RBL_T and RBL_B) signals once a bit cell has been read.

An output buffer of the sense amplifier is formed by transistors 420, 424 and 422. The PMOS transistor 420 and NMOS transistor 422 form the output inverter and have gates driven by the RDB data signal output of NAND gate 412 and have current paths connecting the respective power rails VDDP and VSS to the sense amplifier output (QT).

The sense amplifier is enabled using PMOS transistor 424 and NMOS transistor 426. The gates of transistors 424 and 426 receive a sense amplifier enabling signal SEL_B which is selected to turn on or off the sense amplifier. The SEL_B is the circuit enable signal that is activated by a controller to turn the sense amplifier on and off. The PMOS transistor 424 connects and disconnects the output (QT) from VDDP. The NMOS transistor 426 connects the RDB output from NAND gate 412 to VSS.

Figure 5:
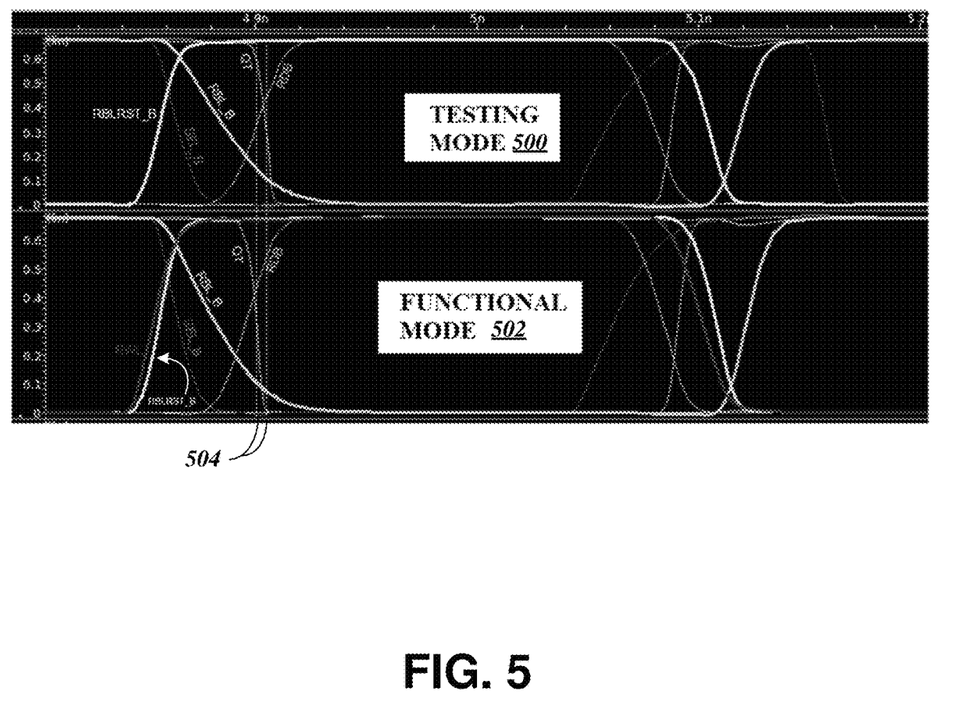
FIG. 5 provides a waveform diagram showing the timing difference between the testing mode and the functional mode using embodiments described herein.

FIG. 5 provides a waveform diagram showing the timing difference between the testing mode and the functional mode using embodiments described herein. The waveform diagrams compare testing mode 500 on the top to functional mode 502 on the bottom. During the testing mode, RBLRST_B triggers the discharge of RBL_B in the sense amplifiers. During the functional mode, RWL triggers the discharge of RBL_B in the bit cell. Since the RBLRST_B signal also controls the BL restore signal, a small amount of misalignment can be tolerated between RBLRST_B and RWL without impacting the access time. Dotted vertical lines 504 compare the transition of the output sense amplifier output (QT) between the two modes, and show a difference between the two modes is less than 4 ps.

Circuitry described in portions of the preceding detailed descriptions is controlled in some embodiments by processors which operate in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for testing memory, comprising:
   receiving a synchronous write through (SWT) mode signal that indicates one of a functional mode of operation of the memory and a testing mode of operation of the memory, wherein the testing mode triggers bypassing of one or more read operations from bit cells of the memory identified by read address signals;
   switching between the functional mode of operation and the testing mode of operation in dependence on the received SWT mode signal; and
   when the memory is in the testing mode of operation, sense amplifiers of the memory (i) receiving test data obtained from the read address signals to represent a test state, (ii) providing the read address signals as sense amplifier outputs and (iii) being disabled from receiving read bitline signals from the bit cells.

2. The method of claim 1, wherein row-address bits are used to address bit cells connected to provide an output of the memory instead of the bit cells to provide alternative outputs bits during the testing mode.

3. The method of claim 2, further comprising:
   deactivating a path for the row-address bits from the output of the memory during the functional mode, when the testing mode is not being implemented, to avoid interference with the functional mode of the memory.

4. The method of claim 3,
   wherein a bitline restore signal enables providing the row-address bits as the test data obtained in the testing mode, and
   wherein the bitline restore signal enables the row-address bits to address the bit cells to output data from the bit cells during the functional mode.

5. The method of claim 4,
   wherein the bitline restore signal further disables read bit lines of the memory during the testing mode, and
   wherein the bitline restore signal further disables the row-address bits from being provided as the testing output when in the functional mode.

6. The method of claim 1, wherein, in the test mode, data (D) is (i) captured in dependence on a clock (CLK) signal and (ii) provided as an output (Q) with a delay to emulate a read operation delay that is present in the functional mode.

7. A system for testing memory, comprising:
   circuitry that receives a synchronous write through (SWT) mode signal and, in dependence on a value of the SWT mode signal, switches between (i) a functional mode of operation of the memory and (ii) testing mode of operation of the memory that triggers bypassing of one or more read operations from bit cells of the memory identified by read address signals (XADR0, XADR1), the circuitry including:
      address circuitry that receives the read address signals identifying the bit cells of the memory and provide outputs as test data; and
   additional circuitry including:
      read write decoder circuitry that receives the read address signals through enabling logic as controlled by the SWT mode signal to provide read write line signals (RWL0, RWL1), wherein the bit cells receive the read write line signals (RWL0, RWL1) from the read write decoder circuitry and provide read bit line state output signals (RBL0, RBL1, RBL2, RBL3) in response; and
      sense amplifiers, wherein when the memory is in the testing mode of operation the sense amplifiers (i) receive the test data to represent a test state, (ii) provide the read address signals as sense amplifier outputs and (iii) are disabled from receiving read bitline signals from the bit cells.

8. The system of claim 7, wherein the sense amplifiers (i) receive values from the bit cells, (ii) receive the read address signals and (iii) switch, in dependence on the SWT mode signal, between providing the bit cell values as the sense amplifier outputs during the functional mode and providing the read address signals as the sense amplifier outputs during the testing mode.

9. The system of claim 8, further including:
output latches that receive the sense amplifier outputs and to provide the test data to circuitry for comparison to intended values represented by the read address signals.

10. The system of claim 9, further comprising:
a clock generator providing a clock signal to the address circuitry, the sense amplifiers and the output latches, wherein, during the testing mode, the read address signals are captured using the clock signal and the test data is provided from the output latches with a delay to emulate a read operation delay that is present in the functional mode.

11. The system of claim 10, wherein the circuitry further comprises:
address enable logic providing the read address signals as bit cell replacement signals in the testing mode as controlled by the SWT signal; and
read enable logic providing the read address signals to the bit cells to provide bit cell values during the functional mode as controlled by the SWT signal.

12. The system of claim 8, wherein the sense amplifiers comprise:
read bit line restore circuitry that (i) during the testing mode, enables the read address signal to be provided as the sense amplifier outputs and prevent values of the bit cells from being provided as the sense amplifier outputs and (ii) during the functional mode, enables the values of the bit cells to be provided as the sense amplifier outputs and disable the read address signals from being provided as the sense amplifier outputs.

13. The system of claim 8, wherein the sense amplifiers include circuitry comprising:
a first NMOS transistor having a gate receiving the SWT mode signal that connects a source supply (VSS) to input nodes of a control node;
a second NMOS transistor having a gate connected to receive a read bit line restore signal and a signal path connecting a bit cell, through a read bit line (RBL) node to the control node;
a third NMOS transistor having a gate connected to receive an inverse of the read bit line restore signal and a signal path connecting a bit cell, through an inverse of the read bit line (RBL_B) node to the control node;
a first PMOS transistor having a gate connected to receive the read bit line restore signal and having a signal path connecting a power supply rail to the read bit line (RBL) node;
a second PMOS transistor having a gate connected to receive the inverse of the read bit line restore signal and having a signal path connecting the power supply rail to the inverse of the read bit line (RBL_B) node; and
a logic gate having inputs connecting to the read bit line (RBL) node and to the inverse of the read bit line (RBL_B) node and having an output (RDB) for driving the sense amplifier outputs.

14. The system of claim 13, wherein the sense amplifiers further comprise keeper circuitry comprising:
three stacked PMOS transistors connecting VDD to provide a keeper control voltage, each of the three stacked PMOS transistors having a gate connected to receive a keeper signal;
a PMOS transistor connecting the keeper control voltage to a shared keeper node and having a gate connected to the output (RDB) of the logic gate;
a PMOS transistor having a gate connected to the read bit line restore signal and a signal path connecting the shared keeper node to the read bit line (RBL) node; and
a PMOS transistor having a gate connected to the read bit line restore signal and a signal path connecting the shared keeper node to an inverse of the read bit line node.

15. The system of claim 14, wherein the sense amplifiers further comprise output driver circuitry comprising:
a PMOS transistor having a gate connected to the output (RDB) of the logic gate, and a signal path connecting the sense amplifier outputs to the power supply rail; and
an NMOS transistor having a gate connected to the output (RDB) of the logic gate, and a signal path connecting the sense amplifier outputs to the source supply (VSS).

16. The system of claim 7, wherein the memory is a two-port memory with different ports for read and write operations.

17. The system of claim 7, wherein the address circuitry provides two read address signals.

18. A non-transitory computer readable medium comprising stored instructions, which when executed by a processor, cause the processor to generate a digital representation of a circuit comprising:
circuitry that receives a synchronous write through (SWT) mode signal and, in dependence on a value of the SWT mode signal, switches between (i) a functional mode of operation of memory and (ii) testing mode of operation of the memory that triggers bypassing of one or more read operations from bit cells of the memory identified by read address signals (XADR0, XADR1), the circuitry including:
address circuitry that receives the read address signals identifying the bit cells of the memory and provide outputs as test data; and
additional circuitry including:
read write decoder circuitry that receives the read address signals through enabling logic as controlled by the SWT mode signal to provide read write line signals (RWL0, RWL1), wherein the bit cells receive the read write line signals (RWL0, RWL1) from the read write decoder circuitry and provide read bit line state output signals (RBL0, RBL1, RBL2, RBL3) in response; and
sense amplifiers, wherein when the memory is in the testing mode of operation the sense amplifiers (i) receive the test data to represent a test state, (ii) provide the read address signals as sense amplifier outputs and (iii) are disabled from receiving read bitline signals from the bit cells.

19. The non-transitory computer readable medium of claim 18, wherein row-address bits of the address circuitry used to address bit cells are connected to an output of the memory instead of the bit cells of the memory to provide alternative outputs bits during the testing mode.

20. The non-transitory computer readable medium of claim 19,
wherein the sense amplifiers (i) receive values from the bit cells, (ii) receive the read address signals and (iii) switch, in dependence on the SWT mode signal, between providing the bit cell values as the sense amplifier outputs during the functional mode and providing the address signals as the sense amplifier outputs during the testing mode, and
wherein the processor is caused to further generate a digital representation of a circuit comprising:
output latches that receive the sense amplifier outputs and to provide the test data to circuitry for comparison to the values represented by the read address signals; and a clock generator providing a clock signal to the address circuitry, the sense amplifiers and the output latches, wherein, during the testing mode, the read address signals are captured using the clock signal and the test data is provided from the output latches with a delay to emulate a read operation delay that is present in the functional mode.

* * * * *